United States Patent
Reynolds et al.

(10) Patent No.: US 8,450,701 B2
(45) Date of Patent: May 28, 2013

(54) VACUUM SYSTEM COLD TRAP FILTER

(75) Inventors: William P. Reynolds, Canton, MA (US);
James Gregg, Methuen, MA (US);
Denis Robitaille, Ipswich, MA (US);
William D. Lee, Newburyport, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 13/089,830

(22) Filed: Apr. 19, 2011

(65) Prior Publication Data

US 2012/0267546 A1    Oct. 25, 2012

(51) Int. Cl.
*G21K 5/04*    (2006.01)
*B01D 8/00*    (2006.01)

(52) U.S. Cl.
USPC ............... 250/441.11; 250/443.1; 250/492.3; 62/55.5; 62/914; 417/228; 417/243

(58) Field of Classification Search
USPC .... 250/441.11, 443.1, 492.1–492.3; 417/228, 417/243; 62/55.5, 100, 914
See application file for complete search history.

(56) References Cited

U.S. PATENT DOCUMENTS

| | | | | |
|---|---|---|---|---|
| 3,652,437 | A * | 3/1972 | Mezey et al. | 204/164 |
| 5,894,131 | A * | 4/1999 | Fukunaga et al. | 250/492.21 |
| 7,837,770 | B2 * | 11/2010 | Lee et al. | 62/55.5 |
| 7,872,247 | B2 * | 1/2011 | Ryding et al. | 250/492.21 |
| 8,089,055 | B2 * | 1/2012 | Brailove | 250/492.2 |
| 2002/0074509 | A1 * | 6/2002 | Quill | 250/432 R |
| 2005/0196284 | A1 * | 9/2005 | Gaudet et al. | 62/55.5 |
| 2006/0243137 | A1 * | 11/2006 | Lee et al. | 95/291 |
| 2008/0073564 | A1 * | 3/2008 | Mun | 250/441.11 |
| 2008/0267790 | A1 * | 10/2008 | Gaudet et al. | 417/205 |
| 2009/0249801 | A1 * | 10/2009 | Hedberg | 62/55.5 |
| 2010/0051825 | A1 * | 3/2010 | Yamashita et al. | 250/423 R |
| 2010/0171044 | A1 * | 7/2010 | Lee et al. | 250/491.1 |
| 2011/0121207 | A1 * | 5/2011 | Brailove | 250/492.21 |

* cited by examiner

*Primary Examiner* — David A Vanore
*Assistant Examiner* — Wyatt Stoffa
(74) *Attorney, Agent, or Firm* — Eschweiler & Associates, LLC

(57) ABSTRACT

A cold trap filter and method is provided for filtering chemical species from a vacuum system of an ion implantation system. A canister is in fluid communication with an exhaust of a high vacuum pump and an intake of a roughing pump used for evacuating an ion source chamber. One or more paddles are positioned within the canister, wherein each paddle has a cooling line in fluid communication with a coolant source. The coolant source passes a coolant through the cooling line, thus cooling the one or more paddles to a predetermined temperature associated with a condensation or deposition point of the chemical species, therein condensing or depositing the chemical species on the paddles while not interfering with a vacuum capacity of the high vacuum and roughing pumps. The paddles can also be electrically biased to electrostatically attract the chemical species to the paddles in one or more biasing steps.

19 Claims, 6 Drawing Sheets

VACUUM SYSTEM COLD TRAP FILTER

TECHNICAL FIELD

The present invention relates generally to a cold trap filtration apparatus for use in combination with vacuum pump systems, and more specifically to a filtering apparatus within an ion implantation system and methods for controlling material buildup within a vacuum pump system.

BACKGROUND

In the manufacture of semiconductor devices and other products, ion implantation systems are used to impart impurities, known as dopant elements, into semiconductor wafers, display panels, or other workpieces. Conventional ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

Conventional ion implantation systems include an ion source that ionizes a desired dopant element which is then accelerated to form an ion beam of prescribed energy. The ion beam is directed at a surface of the workpiece to implant the workpiece with the dopant element. The energetic ions of the ion beam penetrate the surface of the workpiece so that they are embedded into the crystalline lattice of the workpiece material to form a region of desired conductivity. The implantation process is typically performed in high vacuum which prevents collisions with residual gas molecules and which minimizes the risk of contamination of the workpiece by airborne particulates.

During the course of operation of the ion implantation system, a vacuum pump system operates to create a low pressure vacuum environment in one or more regions of the ion implantation system. The vacuum pump system creates a flow that inherently removes specie material and gases from the one or more regions in the ion implantation system. For purposes of the present description, the invention will be described in the context of an ion source vacuum pump system, wherein a vacuum environment is created in the region of an ion source and ion source housing. Some of the removed material often becomes deposited within the vacuum system, such as in a rough vacuum line and roughing pump of the vacuum system. Such a deposition of material can reduce the life of operation of the roughing pump. Further, in cases where source species are changed between implantations (e.g., changing from an n-type specie to a p-type specie), the change in source species can cause deleterious and/or dangerous mixing of the deposited materials in the rough and exhaust vacuum lines.

Conventionally, a mesh pad filter (e.g., stainless steel wool) is placed within the source vacuum line, wherein the mesh is intended to filter material from the vacuum system. Such mesh pads, however, are prone to accumulating material relatively quickly, thus reducing vacuum pump capabilities by restricting flow through the vacuum line, and increasing maintenance downtime incurred by filter maintenance. Further, due to the nature of the conventional mesh pads and the placement of the pad within the vacuum system, deleterious dripping or flaking of filtered material from the mesh pad into the vacuum line is common during both operation and maintenance of the filter, thus causing further problems in the roughing pump. Furthermore, when changing species of implantation, filter changes are typically necessitated in order to avoid dangerous mixing of filtered materials, thus further increasing maintenance downtime.

Accordingly, a need exists for a more robust, yet inexpensive system and methodology for removing materials in vacuum pump subsystems typically associated with ion implantation systems.

SUMMARY

The present invention overcomes the limitations of the prior art by providing an apparatus, system, and method for efficiently filtering materials in an ion implantation vacuum system, wherein vacuum capacity is not adversely affected by the filtering, and wherein downtime due to maintenance is advantageously minimized. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, a cold trap filter for an ion implantation vacuum system is provided, wherein a chamber is provided having one or more chemical species disposed therein. The chamber, in one example, comprises an ion source chamber. Alternatively, the chamber comprises any enclosed area within an ion implantation system, such as an area of an ion beamline, or a process chamber.

A high vacuum pump is provided in fluid communication with the chamber for generating a low pressure vacuum environment therein, and a roughing pump is further provided in fluid communication with the high vacuum pump via a vacuum line. One or more canisters are provided in fluid communication with an exhaust of the high vacuum pump and an intake of the roughing pump via the vacuum line. One or more paddles are positioned within the one or more canisters, wherein each of the one or more paddles comprises a respective cooling line in fluid communication with a respective one or more coolant sources. Each of the one or more coolant sources, for example, is configured to selectively pass a coolant through the respective cooling line. Thus, the coolant is configured to selectively cool the respective one or more paddles to a predetermined temperature associated with a condensation point and/or deposition point of the one or more chemical species. Accordingly, the one or more chemical species are condensed and/or deposited on the one or more paddles.

According to another exemplary aspect, each of the paddles is configured to condense and/or deposit one or more of the one or more chemical species thereon based on the predetermined temperature of the coolant associated with each paddle. For example, several paddles are provided in series, wherein each paddle is cooled to a progressively colder temperature when the one or more chemicals pass from the exhaust of the high vacuum pump toward the roughing pump. Accordingly, each of the several paddles is configured to condense and/or deposit a specific chemical or element thereon, based on the condensation point and/or deposition point of the specific chemical.

In accordance with another exemplary aspect, the cold trap filter further comprises an electrical insulator that electrically insulates one or more of the one or more paddles from the one or more canisters. Further, an electrical power source is operably coupled to one or more of the one or more paddles, wherein the electrical power source is configured to electrically bias the respective one or more paddles with respect to the one or more canisters. Accordingly, the respective electrical bias is further configured to electrostatically attract one or more of the one or more chemical species to the respective one or more paddles. One or more paddles may be further electrically isolated, wherein no biasing is provided. Further, a plurality of paddles may be associated with one canister, or a plurality of canisters, wherein each of the paddles is configured to condense and/or deposit a respective one of a plurality of chemicals or elements.

Furthermore, according to another example, one or more of the canisters, vacuum line, high vacuum pump, and roughing pump are heated, in order to maintain a temperature of interior surfaces exposed to the one or more chemicals at a temperature greater than the predetermined temperature(s) associated with the condensation point(s) and/or deposition point(s) of the one or more chemical species.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
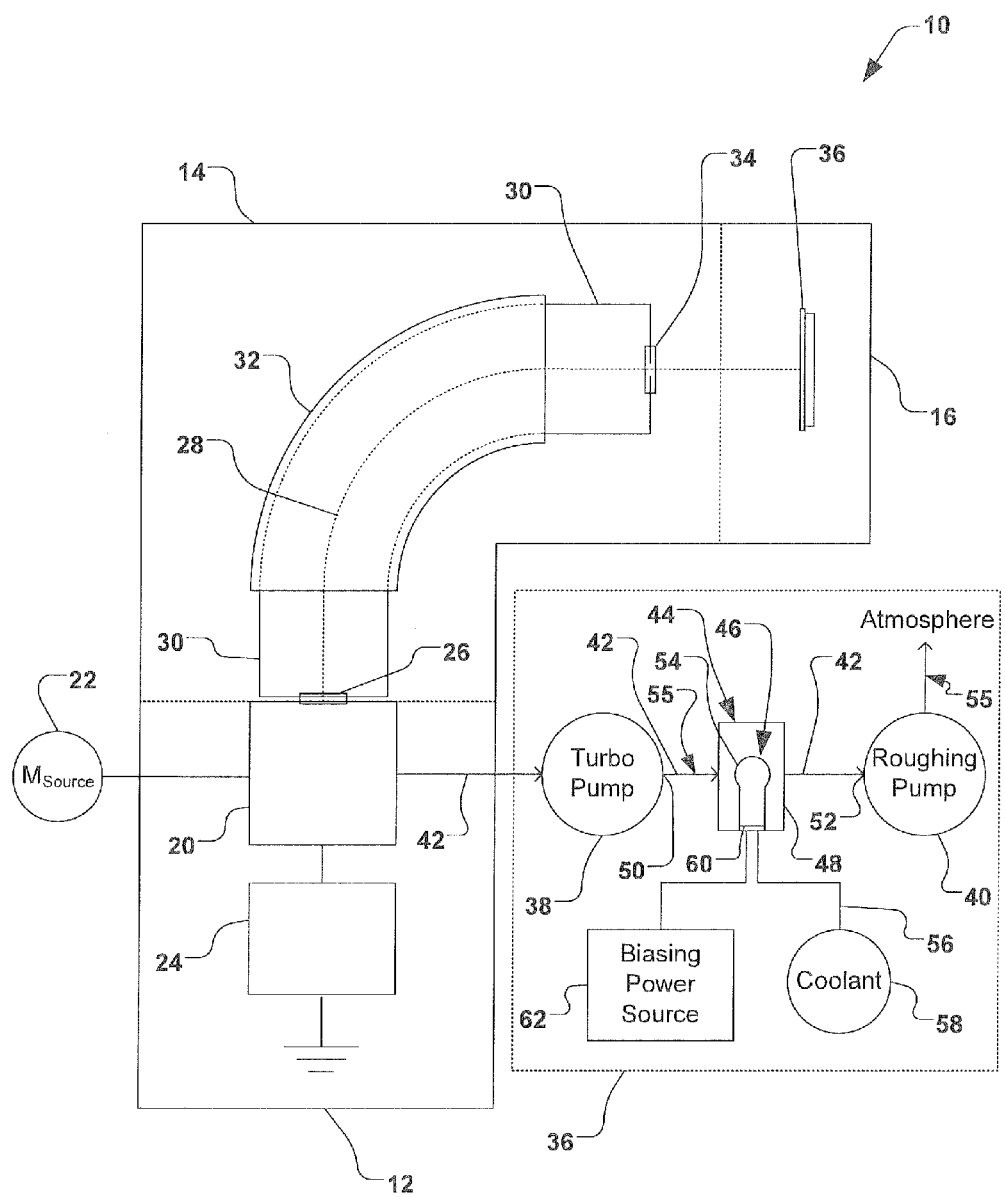
FIG. 1 is a block diagram of an exemplary ion implantation system according to several aspects of the present disclosure.

The present disclosure is directed generally toward a system, apparatus, and method for efficiently filtering materials in an ion implantation vacuum pump system, wherein vacuum capacity is not adversely affected by the filtering, and wherein downtime due to maintenance is advantageously minimized.

Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessary to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

As an overview, a schematic of an exemplary ion implantation system 10 is illustrated in FIG. 1, wherein the ion implantation system comprises a terminal 12, a beamline assembly 14, and an end station 16. The terminal 12, for example, comprises a suitable ion source chamber 20, wherein one or more chemical species 22 (e.g., a source gas, source specie, or combination of gases and/or species) is ionized via a power supply 24. An extraction aperture 26 is configured to extract an ion beam 28 from the ion source chamber 20 and direct the ion beam through the beamline assembly 14, and ultimately, to the end station 16. The beamline assembly 14, for example, comprises a beamguide 30 and a mass analyzer 32 associated therewith, wherein a dipole magnetic field is established to pass only ions of appropriate charge-to-mass ratio through an aperture 34 at an exit end of the beamguide to a workpiece 36 (e.g., a semiconductor wafer, display panel, etc.) disposed in the end station 16.

In order to ionize the one or more chemical species 22 within the ion source chamber 20, a significant low pressure vacuum environment is provided within the source chamber via a vacuum system 36. In the present disclosure, the vacuum system 36 comprises a high vacuum pump 38 in fluid communication with the ion source chamber 20. For purposes of this disclosure, the high vacuum pump 38 is defined as a vacuum pump configured to produce high vacuum to ultra-high vacuum (UHV) pressures of approximately $1\times10^{-5}$ to $1\times10^{-9}$ torr within the ion source chamber. Non-limiting examples of high vacuum pumps 38 are turbo-molecular pumps, cryo-pumps, centrifugal pumps, and the like. A roughing pump 40 is further provided in fluid communication with the high vacuum pump 38 via a vacuum line 42, wherein the roughing pump is configured to step up pressure from the high vacuum pump in order to exhaust to atmosphere. It should be noted that while the vacuum system 36 is associated with the ion source chamber, in the present example, the present disclosure contemplates the vacuum system being similarly applicable to any chamber or enclosed area within the ion implantation system 10 under significant vacuum, such as within the beamline assembly 14, end station 16, and/or any processing chamber or vacuum line(s) associated therewith.

In accordance with one exemplary aspect of the present disclosure, a cold trap filter 44 is provided along the vacuum line 42 between the high vacuum pump 38 and roughing pump 40. The cold trap filter 44, for example, is configured to provide selective condensation and/or deposition of one or more chemical species 22 at one or more predetermined positions 46 downstream of the ion source chamber 20 along the vacuum line 42, as will be discussed in further detail infra. The cold trap filter 44, for example, comprises one or more canisters 48 in fluid communication with an exhaust 50 of the high vacuum pump 38 and an intake 52 of the roughing pump 40.

One or more paddle members 54, for example, are positioned within the one or more canisters 48. It will be understood that while the present invention is described in terms of a so-called "paddle member," this element can take the form of any structure adapted to protrude into a volumetric flow 55 of the vacuum line 42. In a preferred embodiment, as illustrated herein and described further infra, the one or more paddle members 54 comprise a generally planar first side generally facing an inlet of the volumetric flow 55, wherein a flow of the one or more chemical species 22 from the high vacuum pump 38 impinges the generally planar first side of the one or more paddle members.

Each of the one or more paddle members 54 comprises a respective cooling line 56 in fluid communication with a respective one or more coolant sources 58. For example, each of the one or more coolant sources 58 is configured to selectively pass a coolant through the respective cooling line 56, thereby selectively cooling the respective one or more paddle members 54 to a predetermined temperature associated with a condensation point and/or deposition point of one or more of the one or more chemical species 22 at the predetermined positions 46 of the respective one or more paddle members.

Various configurations of cold trap filters 44 are possible for filtering various chemical species 22 within the vacuum system 36. For example, a single paddle 54 is provided within a single canister 48, wherein the paddle is cooled to a predetermined temperature associated with the condensation/deposition temperature of one or more of the chemical species 22 provided to the ion source chamber 20. Alternatively, in another example, a plurality of paddle members 54 are provided in series within a single canister 48, wherein each of the one or more paddle members is cooled to a progressively colder predetermined temperature when the one or more chemical species 22 pass from the exhaust 50 of the high vacuum pump 38 toward the inlet 52 of the roughing pump 40. Accordingly, each of the plurality of paddle members 54 may be configured to condense and/or deposit a specific chemical composition or element thereon, based on the condensation point and/or deposition point of the specific chemical composition or element. Alternatively, a plurality of cold trap filters 44, each having their own respective paddle(s) 54 and canister(s) 48 associated therewith can be provided along the vacuum line 42. All such configurations of cold trap filters 44 are contemplated as falling within the scope of the present invention.

According to another exemplary aspect, the cold trap filter 44 further comprises an electrical insulator 60 configured to electrically insulate or isolate one or more of the one or more paddle members 54 from the one or more canisters 48. Further, an electrical power source 62 is operably coupled to one or more of the one or more paddle members 54, wherein the electrical power source is configured to electrically bias the respective one or more paddle members to electrostatically attract one or more of the one or more chemical species 22 to the respective one or more paddle members 54. Furthermore, according to another example, one or more of the paddle members 54 are electrically isolated, wherein no biasing is provided.

Figure 2:
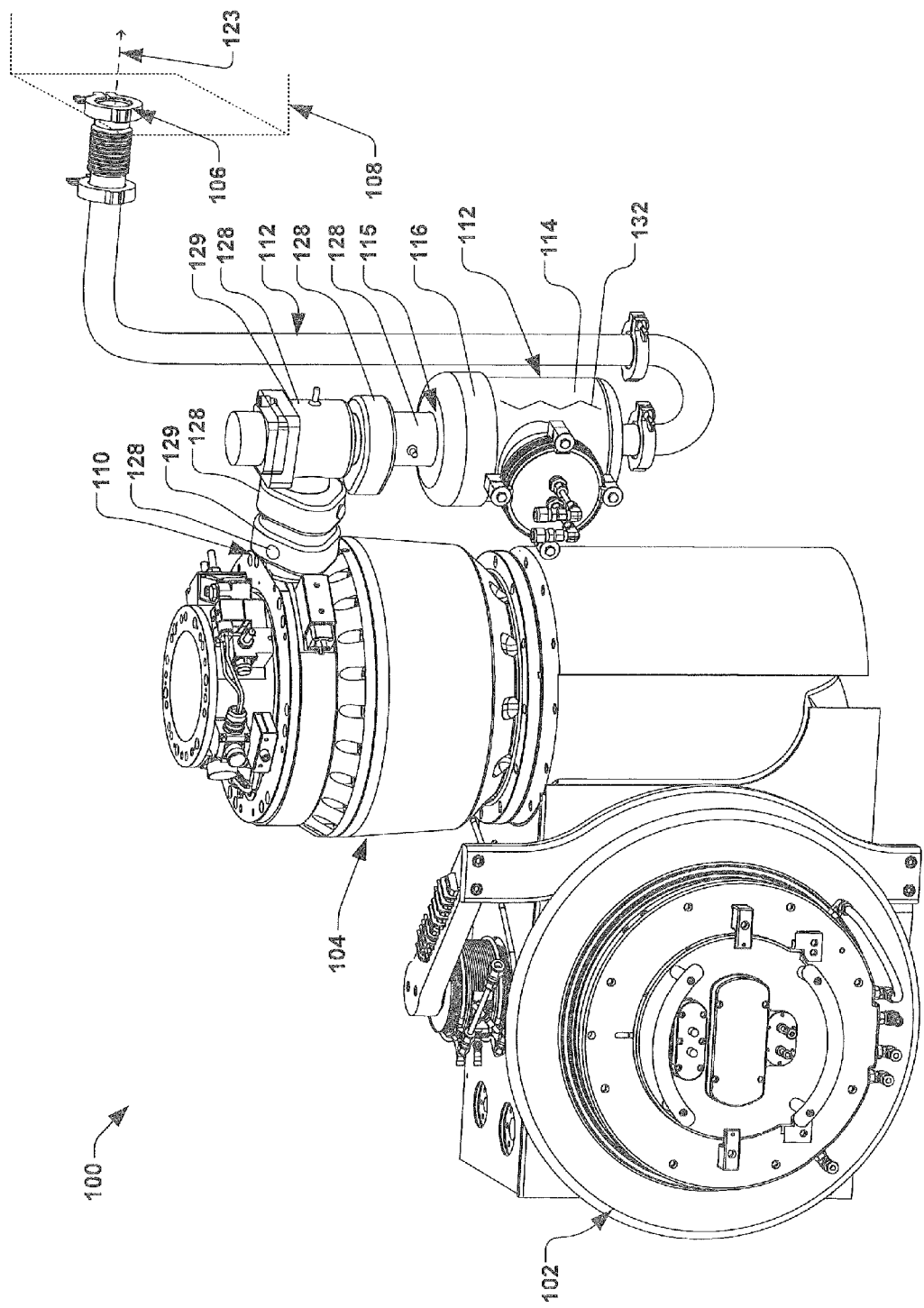
FIG. 2 illustrates an ion source vacuum system having a cold trap filter assembly in accordance with one exemplary aspect of the disclosure.
Figure 3:
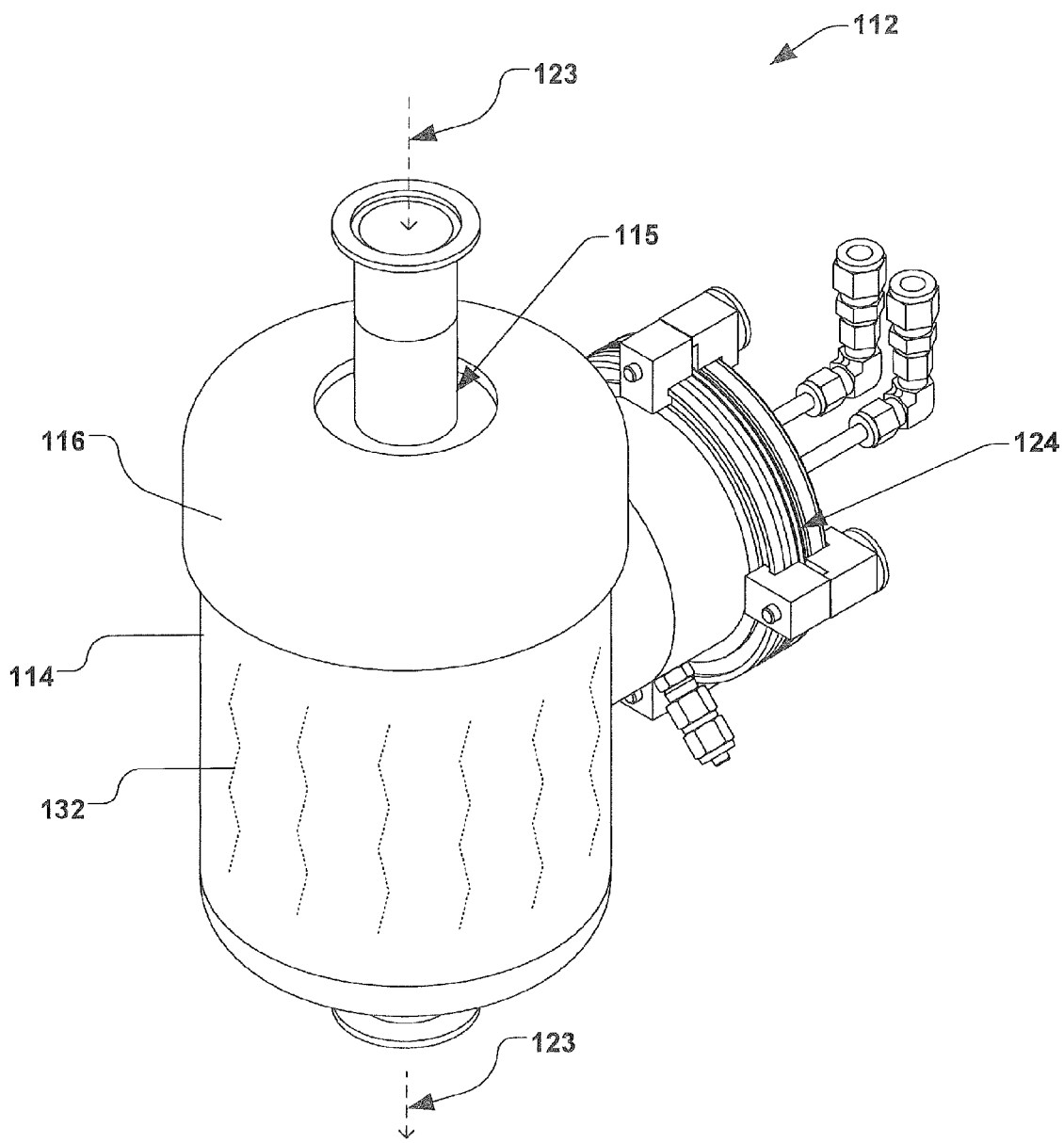
FIG. 3 illustrates a cold trap filter assembly in accordance with another example of the disclosure.

FIG. 2 illustrates an exemplary ion implantation vacuum system 100, such as could be implemented in association with the vacuum system 36 of the ion implantation system 10 of FIG. 1, wherein several aspects of the disclosure are illustrated in greater detail. As illustrated in FIG. 2, the exemplary ion implantation vacuum system 100 comprises an ion source chamber 102 and a high vacuum pump 104 in fluid communication with the ion source chamber. Again, it is noted that while the ion implantation vacuum system 100 of FIG. 2 is illustrated with respect to the ion source chamber 102, any high-vacuum region or chamber within an ion implantation system can be substituted for the ion source chamber, and all such chambers are contemplated as falling within the scope of the present invention. An intake 106 to a roughing pump 108 (shown in phantom), for example, is in fluid communication with an exhaust 110 of the high vacuum pump 104, and one or more cold trap filter assemblies 112 are disposed between the roughing pump and the high vacuum pump.

In accordance with one example, FIGS. 3, 4A-4B, and 5 illustrate various views of the exemplary cold trap filter assembly 112, wherein the cold trap filter assembly comprises a canister 114 in fluid communication with the exhaust 110 of the high vacuum pump 104 and the intake 106 of the roughing pump 108. In the present example, the canister 114 further comprises an insulative shield 116 associated with the exhaust 110 of the high vacuum pump 104, wherein the insulative shield generally provides thermal insulation to generally prevent condensation and/or deposition at or near an inlet 115 of the canister.

One or more paddles 118 (e.g., illustrated in FIGS. 4B and 5) are positioned within the canister 114, wherein the one or more paddles comprise one or more cooling lines 120 in fluid communication with the coolant source (e.g., illustrated in FIG. 1). Accordingly, the coolant source is configured to selectively pass a coolant through the one or more cooling lines 120, therein selectively cooling the paddle 118 to the predetermined temperature associated with the condensation point and/or deposition point of one or more of the one or more chemical species at the position of the one or more paddles. According to one example, the paddle 118 is comprised of a heat conductive metal such as aluminum and/or nickel, and comprises a generally planar side 122 generally facing the inlet 115 of the canister 114, as illustrated in FIG. 5. Accordingly, a flow 123 (e.g., including the one or more chemical species) from the high vacuum pump 104 of FIG. 2 impinges the generally planar side of the paddle 118, wherein once the one or more chemical species condense and/or deposit on the generally planar side 122, removal of the one or more chemical species can be easily accomplished during maintenance of the cold trap filter assembly 112.

It should be noted that the one or more paddles 118 and/or canister 114 are sized to generally permit the flow 123 and volume through the cold trap filter assembly 112 that is generally consistent with a pumping efficiency and pumping size associated with typical pumping of the chamber 102. For example, as compared to conventional mesh-type filters, the cold trap filter assembly 112 of the present disclosure has a much greater capacity to filter (i.e., condense and/or deposit) the one or more chemical species onto the one or more paddles 118 without encumbering a pumping efficiency of the system. The sizing of the one or more paddles 118 with respect to the canister 114, for example, can be determined such that sufficient flow 123 is permitted to pass the one or more paddles in order to allow for efficient pumping, even when a significant amount of the one or more chemical species are condensed and/or deposited on the one or more paddles. The cold trap filter assembly 112, including the one or more paddles 118 and/or canister 114, can be sized to fit any pumping application within any ion implantation system.

According to another example, the paddle 118 is removably coupled to the canister 114 via one or more vacuum-seal interfaces 124, wherein removal of the paddle from the canister is further facilitated. In yet another example, a cover 126 is further provided, wherein the cover comprises an expendable metal foil configured to cover the paddle 118, and thus further ease maintenance of the paddle. For example, the one or more chemical species condense and/or deposit on the cover 126, and thus, during maintenance, the cover can be removed, discarded, and/or replaced. The cover 126, in one example, comprises aluminum, nickel or other metal foil or foil-like substrate that generally covers and is in general thermal contact with the 118, therein providing a simple and cost-effective solution for maintaining the cold trap filter 112.

One or more vacuum line heat sources 128 and/or insulators 129 are further provided in another example, as illustrated in FIG. 2, wherein the vacuum line heat sources and insulators are configured to maintain a temperature of one or more vacuum lines 130 entering and/or exiting the canister 114 at a temperature greater than the predetermined temperature associated with the condensation point and/or deposition point of the one or more chemical species. According to another example, the cold trap filter assembly 112 comprises one or more heat sources 132 configured to maintain a temperature of one or more interior walls 134 (e.g., as illustrated in FIG. 4B) of the canister 114 at a temperature greater than the predetermined temperature associated with the condensation point and/or deposition point of the one or more chemical species.

Furthermore, according to another example, one or more of the canister 114, vacuum line 130, high vacuum pump 104, and roughing pump 108 are heated, wherein a temperature of interior surfaces exposed to the one or more chemical species is generally maintained at a temperature greater than the predetermined temperature(s) associated with the condensation point(s) and/or deposition point(s) of the one or more chemical species.

Figure 6:
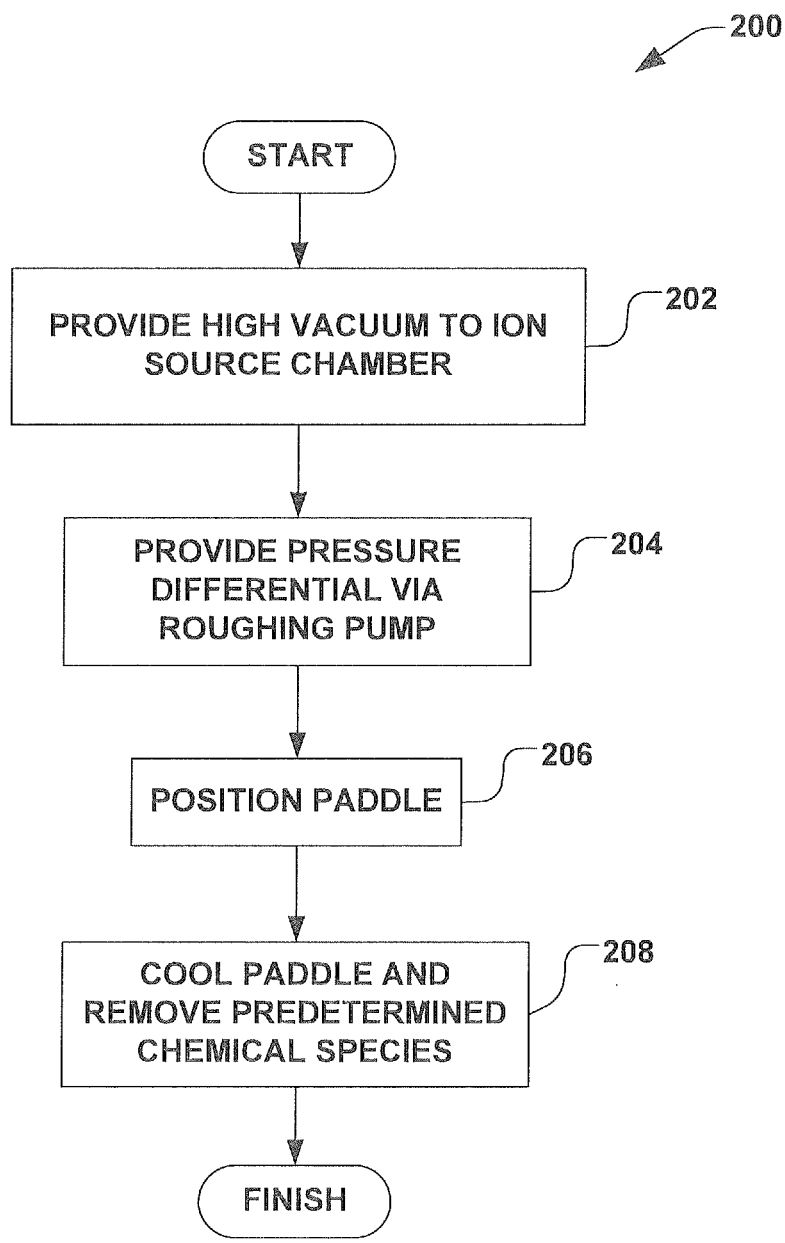
FIG. 6 illustrates a methodology for filtering one or more chemical species from a vacuum system according to still another exemplary aspect of the disclosure.

In accordance with yet another exemplary aspect of the present disclosure, FIG. 6 illustrates an exemplary method 200 for filtering material in an ion implantation vacuum system. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 4:
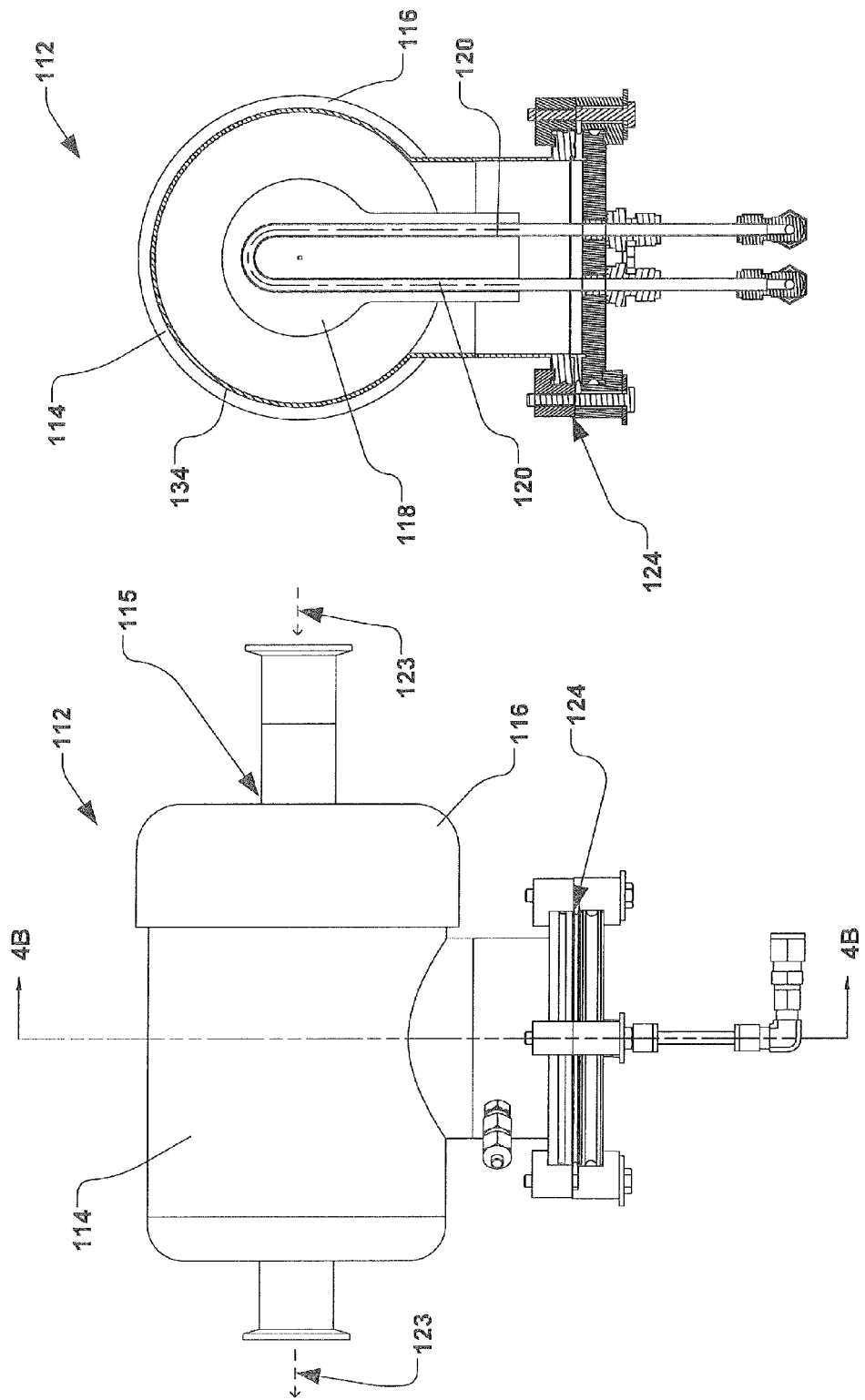
FIGS. 4A and 4B illustrate side and cross-sectional views of an exemplary cold trap filter assembly according to still another aspect of the disclosure.
Figure 5:
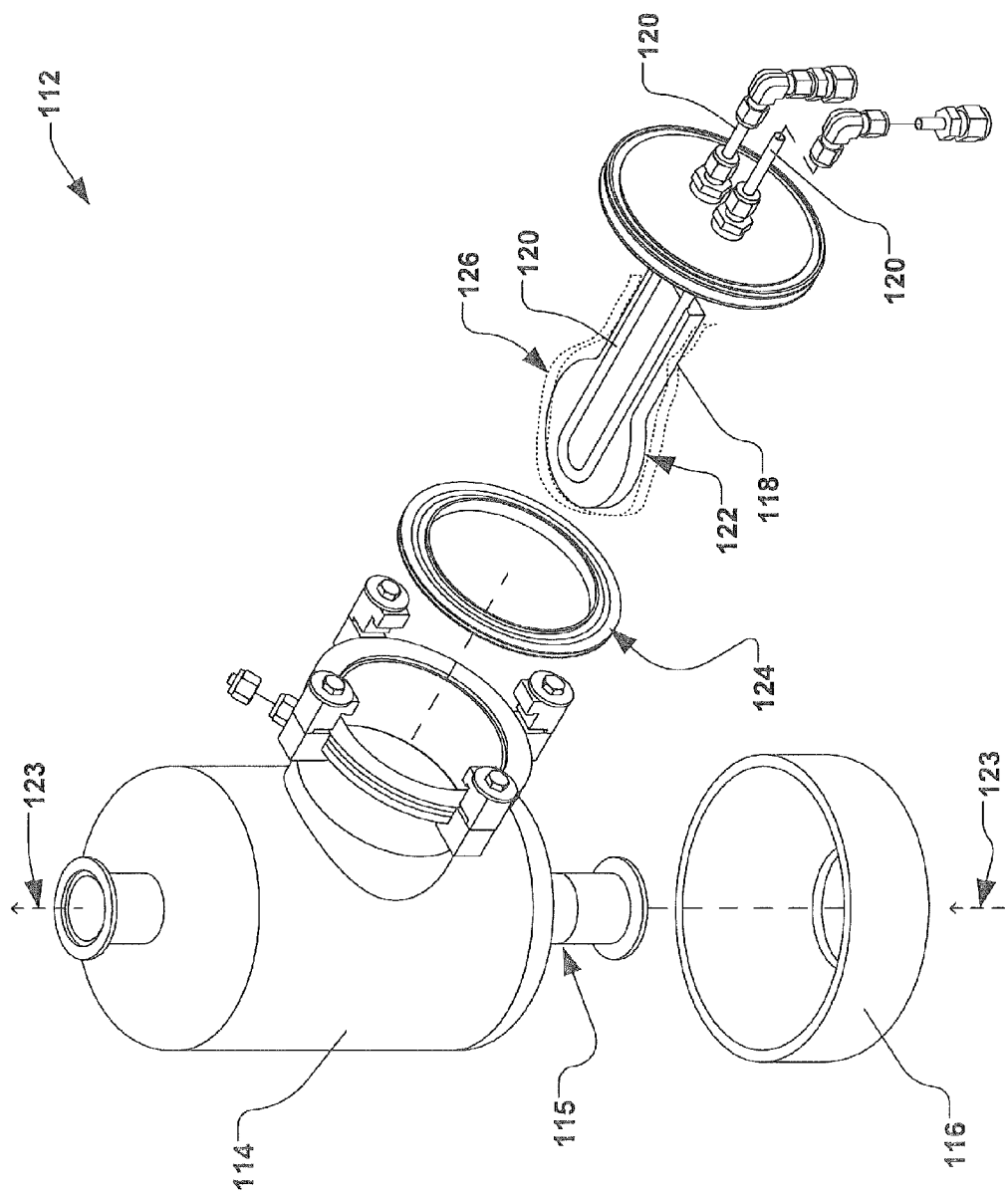
FIG. 5 illustrates a blown-up diagram of the exemplary cold trap filter assembly in accordance with yet another aspect of the disclosure.

The method 200 of FIG. 4 begins at act 202, wherein a high vacuum environment is provided via a high vacuum pump to an ion source chamber having one or more chemical species disposed therein. In act 204, a roughing pump is provided downstream of the ion source chamber, wherein a pressure differential is formed between an exhaust of the high vacuum pump and atmosphere. One or more paddles are positioned within a vacuum line connecting the an intake of the roughing pump to the exhaust of the high vacuum pump in act 206, and the one or more paddles are cooled in act 208. The one or more paddles are cooled in act 208 to a predetermined temperature associated with a condensation point and/or deposition point of one or more of the one or more chemical species at the position of the respective one or more paddles, thereby condensing and/or depositing the one or more of the one or more chemical species on the one or more paddles.

According to one example, one or more of the vacuum line, high vacuum pump, and roughing pump are further heated to a temperature higher than the predetermined temperature associated with a condensation point and/or deposition point of one or more of the one or more chemical species. According to another example, one or more paddles are further electrically biased, thereby electrostatically attracting the one or more chemical species to the one or more paddles.

Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

What is claimed is:

1. A cold trap filter system for filtering one or more chemical species from a volumetric flow, comprising:
    a high vacuum pump in fluid communication with a chamber having a gas therein, wherein the gas includes the one or more chemical species disposed therein;
    a roughing pump in fluid communication with the high vacuum pump;
    one or more canisters in fluid communication with an exhaust of the high vacuum pump and an intake of the roughing pump;
    one or more coolant sources;

one or more paddles positioned within the one or more canisters, wherein each of the one or more paddles comprises a respective cooling line in fluid communication with the respective one or more coolant sources, wherein the each of the one or more coolant sources is configured to selectively pass a coolant through the respective cooling line, thereby selectively cooling the respective one or more paddles to a predetermined temperature associated with a condensation point and/or deposition point of one or more of the one or more chemical species at the position of the respective one or more paddles;

an electrical insulator, wherein the electrical insulator electrically insulates one or more of the one or more paddles from the one or more canisters; and an electrical power source operably coupled to one or more of the one or more paddles, wherein the electrical power source is configured to electrically bias the respective one or more paddles with respect to the one or more canisters, and wherein the electrical bias is configured to electrostatically attract one or more of the one or more chemical species to the respective one or more paddles.

2. The cold trap filter system of claim 1, wherein the high vacuum pump comprises a turbo-molecular pump.

3. The cold trap filter system of claim 1, wherein the one or more paddles are comprised of one or more of aluminum and nickel.

4. The cold trap filter system of claim 1, wherein the one or more canisters comprises a canister heat source configured to maintain a temperature of one or more interior walls of the one or more canisters at a temperature greater than the predetermined temperature associated with the condensation point and/or deposition point of the one or more of the one or more chemical species at the position of the one or more paddles.

5. The cold trap filter system of claim 4, further comprising a vacuum line heat source configured to maintain a temperature of one or more vacuum lines entering and/or exiting the one or more canisters at a temperature greater than the predetermined temperature associated with the condensation point and/or deposition point of the one or more of the one or more chemical species at the position of the one or more paddles.

6. The cold trap filter system of claim 1, further comprising one or more removable covers configured to selectively cover each of the one or more paddles, respectively.

7. The cold trap filter system of claim 6, wherein the one or more removable covers are comprised of a metal foil.

8. The cold trap filter system of claim 1, wherein the one or more paddles are removably coupled to the one or more canisters via one or more vacuum-seal interfaces.

9. The cold trap filter system of claim 1, wherein the one or more canisters further comprise an insulative shield associated with the exhaust of the high vacuum pump, wherein the insulative shield further provides thermal insulation between the one or more canisters and the high vacuum pump.

10. The cold trap filter system of claim 1, wherein each of the one or more paddles comprise a generally planar first side generally facing an inlet of the one or more canisters, wherein a flow of the one or more chemical species from the high vacuum pump impinges the generally planar first side of the one or more paddles.

11. An ion implantation system, comprising:
an ion source chamber;
a material source configured to provide one or more chemical species to the ion source chamber;
a power supply configured to ionize the one or more chemical species within the ion source chamber;
an extraction assembly configured to extract ions from the ion source chamber, therein defining an ion beam;
a high vacuum pump in fluid communication with the ion source chamber;
a roughing pump having an intake in fluid communication with an exhaust of the high vacuum pump; and
one or more cold trap filter assemblies disposed between the roughing pump and the high vacuum pump, each cold trap filter assembly comprising:
a canister in fluid communication with the exhaust of the high vacuum pump and the intake of the roughing pump;
a coolant source; and
one or more paddles positioned within the canister, wherein the one or more paddles comprise one or more cooling lines in fluid communication with the coolant source, wherein the coolant source is configured to selectively pass a coolant through the one or more cooling lines, therein selectively cooling the paddle to a predetermined temperature associated with a condensation point and/or deposition point of one or more of the one or more chemical species at the position of the one or more paddles, and wherein one or more of the one or more cold trap filter assemblies further comprises:
an electrical insulator, wherein the electrical insulator electrically insulates one or more of the one or more paddles from the canister; and
an electrical power source operably coupled to one or more of the one or more paddles, wherein the electrical power source is configured to electrically bias the respective one or more paddles with respect to the canister, and wherein the electrical bias is configured to electrostatically attract one or more of the one or more chemical species to the respective one or more paddles.

12. The ion implantation system of claim 11, wherein the canister comprises a canister heat source configured to maintain a temperature of one or more interior walls of the canister at a temperature greater than the predetermined temperature associated with the condensation point and/or deposition point of the one or more of the one or more chemical species at the position of the one or more paddles, respectively.

13. The ion implantation system of claim 11, further comprising a vacuum line heat source configured to maintain a temperature of one or more vacuum lines entering and/or exiting the canister at a temperature greater than the predetermined temperature associated with the condensation point and/or deposition point of the one or more of the one or more chemical species at the position of the one or more paddles, respectively.

14. The ion implantation system of claim 11, wherein the canister further comprises an insulative shield associated with the exhaust of the high vacuum pump, wherein the insulative shield further provides thermal insulation between the canister and the high vacuum pump.

15. The ion implantation system of claim 11, wherein the plurality of paddles are removably coupled to the one or more canisters via one or more vacuum-seal interfaces.

16. The ion implantation system of claim 11, wherein each of the one or more paddles comprise a generally planar first side generally facing an inlet of the canister, wherein a flow of the one or more chemical species from the high vacuum pump impinges the generally planar first side of the one or more paddles, respectively.

17. A method for filtering material in an ion implantation vacuum system, the method comprising:

providing a high vacuum via a high vacuum pump to an ion source chamber having one or more chemical species disposed therein;

providing a roughing pump downstream of the ion source chamber, wherein a pressure differential is formed between an exhaust of the high vacuum pump and atmosphere;

positioning one or more paddles within a vacuum line connecting an intake of the roughing pump to the exhaust of the high vacuum pump;

cooling the one or more paddles to a predetermined temperature associated with a condensation point and/or deposition point of one or more of the one or more chemical species at the position of the respective one or more paddles, therein condensing and/or depositing the one or more of the one or more chemical species on the one or more paddles; and electrically biasing the one or more paddles, therein electrostatically attracting the one or more chemical species to the one or more paddles.

18. A cold trap filter system for filtering one or more chemical species from a volumetric flow, comprising:

a high vacuum pump in fluid communication with a chamber having a gas therein, wherein the gas includes the one or more chemical species disposed therein;

a roughing pump in fluid communication with the high vacuum pump;

one or more canisters in fluid communication with an exhaust of the high vacuum pump and an intake of the roughing pump;

a plurality of coolant sources;

a plurality of paddles positioned within the one or more canisters, wherein each of the plurality of paddles comprises a respective cooling line in fluid communication with the respective plurality of coolant sources, wherein the each of the plurality of coolant sources is configured to selectively pass a respective coolant through the respective cooling line, thereby selectively cooling each of the respective plurality of paddles to a respective predetermined temperature associated with a condensation point and/or deposition point of one or more of the one or more chemical species at the position of the respective plurality of paddles;

an electrical insulator, wherein the electrical insulator electrically insulates one or more of the plurality of paddles from the one or more canisters; and an electrical power source operably coupled to one or more of the plurality of paddles, wherein the electrical power source is configured to electrically bias the respective one or more of the plurality of paddles with respect to the one or more canisters, and wherein the electrical bias is configured to electrostatically attract one or more of the one or more chemical species to the respective one or more of the plurality of paddles.

19. An ion implantation system, comprising:

an ion source chamber;

a material source configured to provide one or more chemical species to the ion source chamber;

a power supply configured to ionize the one or more chemical species within the ion source chamber;

an extraction assembly configured to extract ions from the ion source chamber, therein defining an ion beam;

a high vacuum pump in fluid communication with the ion source chamber;

a roughing pump having an intake in fluid communication with an exhaust of the high vacuum pump; and one or more cold trap filter assemblies disposed between the roughing pump and the high vacuum pump, each cold trap filter assembly comprising:

one or more canisters in fluid communication with the exhaust of the high vacuum pump and the intake of the roughing pump;

a coolant source; and a plurality of paddles positioned within the one or more canisters, wherein the plurality of paddles comprise a respective plurality of cooling lines in fluid communication with the coolant source, wherein the coolant source is configured to selectively pass a coolant through the plurality of cooling lines at a plurality of temperatures, respectively, therein selectively cooling each of the plurality of paddles to a respective predetermined temperature associated with a respective condensation point and/or deposition point of one or more of the one or more chemical species at the position of the plurality of paddles, respectively;

an electrical insulator, wherein the electrical insulator electrically insulates one or more of the plurality of paddles from the one or more canisters; and an electrical power source operably coupled to one or more of the plurality of paddles, wherein the electrical power source is configured to electrically bias the respective one or more of the plurality of paddles with respect to the one or more canisters, and wherein the electrical bias is configured to electrostatically attract one or more of the one or more chemical species to the respective one or more of the plurality of paddles.

* * * * *